US009748074B2

(12) United States Patent
Ogasawara

(10) Patent No.: US 9,748,074 B2
(45) Date of Patent: Aug. 29, 2017

(54) DATA GENERATING APPARATUS, ENERGY BEAM WRITING APPARATUS, AND ENERGY BEAM WRITING METHOD

(71) Applicant: NuFlare Technology, Inc., Yokohama-shi (JP)

(72) Inventor: Munehiro Ogasawara, Hiratsuka (JP)

(73) Assignee: NuFlare Technology, Inc., Yokohama-shi (JP)

( * ) Notice: Subject to any disclaimer, the term of this patent is extended or adjusted under 35 U.S.C. 154(b) by 157 days.

(21) Appl. No.: 14/797,714

(22) Filed: Jul. 13, 2015

(65) Prior Publication Data

US 2016/0071692 A1  Mar. 10, 2016

(30) Foreign Application Priority Data

Sep. 5, 2014  (JP) .................................. 2014-181217

(51) Int. Cl.
| | | |
|---|---|---|
| *G21K 1/08* | (2006.01) | |
| *H01J 37/302* | (2006.01) | |
| *H01J 37/317* | (2006.01) | |

(52) U.S. Cl.
CPC ...... *H01J 37/3026* (2013.01); *H01J 37/3177* (2013.01)

(58) Field of Classification Search
CPC ............... H01J 37/3002; H01J 37/3005; H01J 37/3171; H01J 37/3174; H01J 37/3177; H01J 2237/30416; H01J 2237/30411; H01J 2237/3175; H01J 2237/31762; H01J 2237/31764

(Continued)

(56) References Cited

U.S. PATENT DOCUMENTS

| | | | |
|---|---|---|---|
| 2013/0232453 A1* | 9/2013 | Liu ..................... | G06F 17/5081 716/52 |
| 2015/0035851 A1* | 2/2015 | Chen ..................... | G09G 5/02 345/596 |

FOREIGN PATENT DOCUMENTS

| | | |
|---|---|---|
| JP | 10-261557 A | 9/1998 |
| JP | 2005-513770 A | 5/2005 |

(Continued)

OTHER PUBLICATIONS

Combined Office Action and Search Report issued Nov. 15, 2016 in Taiwanese Application No. 104123089 (with English translation of Categories of Cited Documents).

*Primary Examiner* — Jason McCormack
(74) *Attorney, Agent, or Firm* — Oblon, McClelland, Maier & Neustadt, L.L.P.

(57) ABSTRACT

In one embodiment, a data generating apparatus generates data including an irradiation amount of a beam in each pixel for an energy beam writing apparatus. The data generating apparatus includes a target irradiation amount calculating section configured to calculate a first irradiation amount in each pixel, an irradiation amount rounding section configured to round the first irradiation amount based on an irradiation amount control unit and calculate a second irradiation amount, a difference calculating section configured to calculate a first difference between the first irradiation amount and the second irradiation amount, a difference sum calculating section configured to calculate a sum of the first differences in a first group of a plurality of adjacent pixels, and an allocating section configured to allocate an irradiation amount based on the irradiation amount control unit and the sum to a pixel in the first group.

10 Claims, 7 Drawing Sheets

(58) Field of Classification Search
USPC ......... 250/369 R, 397, 492.1, 492.2, 492.22,
250/492.3
See application file for complete search history.

(56) References Cited

FOREIGN PATENT DOCUMENTS

| | | |
|---|---|---|
| JP | 2014-17391 A | 1/2014 |
| JP | 2014-112639 A | 6/2014 |
| TW | 201003710 A1 | 1/2010 |
| TW | 201115614 A1 | 5/2011 |
| TW | 201338552 A | 9/2013 |
| TW | 201432772 A | 8/2014 |

* cited by examiner

FIG.7A
TARGET IRRADIATION
AMOUNT D1
| | | | |
|---|---|---|---|
| | 2.0 | 2.0 | 2.5 |
| | 2.0 | 2.3 | 2.6 |
| | 2.0 | 2.0 | 2.5 |
| | | | |
FIG.7B
IRRADIATION
AMOUNT D2
| | | | |
|---|---|---|---|
| | 2 | 2 | 2 |
| | 2 | 2 | 2 |
| | 2 | 2 | 2 |
| | | | |
FIG.7C
DIFFERENCE dif1
| | | | |
|---|---|---|---|
| | 0 | 0 | 0.5 |
| | 0 | 0.3 | 0.6 |
| | 0 | 0 | 0.5 |
| | | | |
FIG.7D
IRRADIATION AMOUNT D3
ALLOCATED TO CENTER PIXEL
| | | | |
|---|---|---|---|
| | 2 | 2 | 2 |
| | 2 | 4 | 2 |
| | 2 | 2 | 2 |
| | | | |
FIG.7E
IRRADIATION AMOUNT D3
ALLOCATED TO PIXEL
INCLUDING BARYCENTER
| | | | |
|---|---|---|---|
| | 2 | 2 | 2 |
| | 2 | 2 | 4 |
| | 2 | 2 | 2 |
| | | | |
FIG.8A
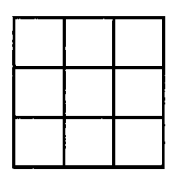
FIG.8B
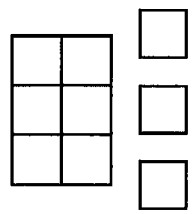
FIG.8C
TARGET IRRADIATION
AMOUNT D1
| 2.0 | 2.0 | | 2.5 | |
|---|---|---|---|---|
| 2.0 | 2.8 | × | 2.3 | |
| 2.0 | 2.0 | | 2.5 | |
FIG.8D
IRRADIATION AMOUNT D3
| 2 | 2 | 2 |
|---|---|---|
| 2 | 2 | 4 |
| 2 | 2 | 2 |
FIG.8E
IRRADIATION AMOUNT D3
| 2 | 2 | 2 |
|---|---|---|
| 2 | 3 | 3 |
| 2 | 2 | 2 |

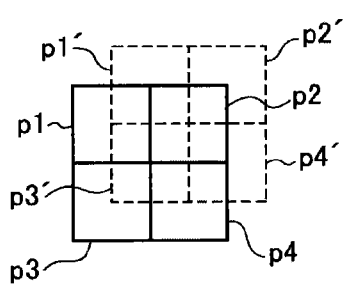

US 9,748,074 B2

DATA GENERATING APPARATUS, ENERGY BEAM WRITING APPARATUS, AND ENERGY BEAM WRITING METHOD

CROSS REFERENCES TO RELATED APPLICATION

This application is based upon and claims the benefit of priority from the prior Japanese Patent Application No. 2014-181217 filed on Sep. 5, 2014, the entire contents of which are Incorporated herein by reference.

FIELD

The present invention relates to a data generating apparatus, an energy beam writing apparatus, and an energy beam writing method.

BACKGROUND

With an increase in the density of LSI, the circuit line width required for semiconductor devices has decreased through the years. To form a desired circuit pattern for these semiconductor devices, an original image pattern (also referred to as a reticle or a mask) with high precision is needed. Such an original image pattern with high precision is produced by using an electron beam lithography technique with an electron beam writing apparatus.

Examples of the electron beam writing apparatus include a multi-beam writing apparatus with an increased throughput by applying a large number of beams at a time with a multi-beam technique. In this multi-beam writing apparatus, for example, multiple beams are formed by letting an electron beam emitted from an electron gun pass through an aperture member having a plurality of apertures, and blanking control is performed for each of the beams. Unblocked beams are diminished in an optical system and applied onto a desired location on a mask to be written. The period of application of a beam is controlled for each pixel area (pixel) onto which one beam is applied.

In the case of performing pattern writing with gray scale control in consideration of the spread of electron beams or correction of line width variations due to, for example, a proximity effect in the electron beam writing apparatus, to control an irradiation amount distribution with high precision, the irradiation time assigned to each pixel area has fractional portions shorter than a minimum control unit period that can be controlled with the writing apparatus. It is technically difficult to reduce the minimum control unit of the irradiation time in the writing apparatus, and thus, electron beams cannot be applied onto each pixel area for a desired irradiation time. Consequently, it is difficult to increase the writing precision.

BRIEF DESCRIPTION OF THE DRAWINGS

FIGS. 7A, 7B, 7C, 7D, and 7E show examples of calculation of the irradiation amount.

FIGS. 8A, 8B, 8C, 8D, and 8E show examples of calculation of the irradiation amount.

FIGS. 9A, 9B, and 9C show examples of calculation of the irradiation amount.

FIGS. 10A, 10B, 10C, an 10D show examples of calculation of the irradiation amount.

DETAILED DESCRIPTION

In one embodiment, a data generating apparatus generates data including an irradiation amount of a beam in each pixel on an object for an energy beam writing apparatus that writes a pattern by irradiating the object with an energy beam. The data generating apparatus includes a target irradiation amount calculating section configured to calculate a first irradiation amount in each pixel based on writing data, an irradiation amount rounding section configured to round the first irradiation amount based on a predetermined irradiation amount control unit and calculate a second irradiation amount with respect to each pixel, a difference calculating section configured to calculate a first difference that is a difference between the first irradiation amount and the second irradiation amount with respect to each pixel, a difference sum calculating section configured to calculate a sum of the first differences in a first group of a plurality of adjacent pixels, and an allocating section configured to allocate an irradiation amount based on the irradiation amount control unit and the sum of the first differences to a pixel in the first group and calculate a third irradiation amount in each pixel.

An embodiment of the present invention will be described with reference to the drawings.

Figure 1:
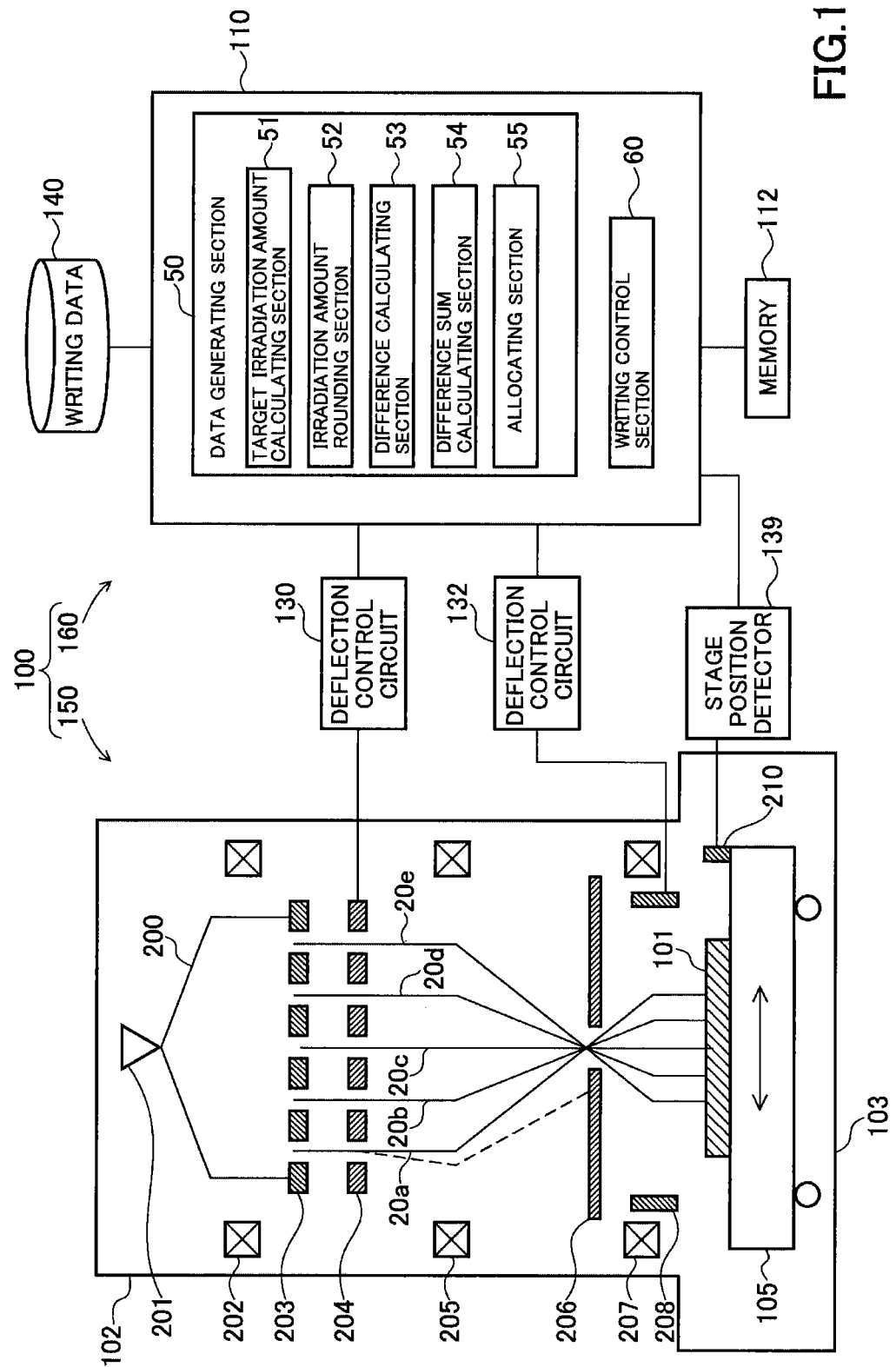
FIG. 1 schematically illustrates an energy beam writing apparatus according to an embodiment of the present invention.

FIG. 1 schematically illustrates an energy beam writing apparatus according to an embodiment of the present invention. In this embodiment, a configuration using electron beams will be described as an example of energy beams. The energy beams are, however, not limited to electron beams and may be charged particle beams such as ion beams or laser beams.

A writing apparatus 100 illustrated in FIG. 1 includes a writing section 150 for writing a desired pattern by irradiating an object such as a mask or a wafer with electron beams and a control section 160 for controlling writing operation by the writing section 150. The writing section 150 includes an electron beam optical column 102 and a writing chamber 103.

The electron beam optical column 102 houses an electron gun 201, an illuminating lens 202, an aperture member 203, a blanking plate 204, a reducing lens 205, a restricting aperture member 206, an objective lens 207, and a deflector 208. The writing chamber 103 contains an XY stage 105. A mask 101 as a target substrate of writing is placed on the XY stage 105. Examples of the object include a wafer and a mask for exposure with which a pattern is transferred to the wafer. The mask includes mask blanks on which a pattern is yet to be formed. A mirror 210 for positioning the XY stage 105 is also placed on the XY stage 105.

The control section 160 includes a control calculating section 110, a memory 112, deflection control circuits 130 and 132, a stage position detector 139, and a memory device 140 such as a magnetic disk device. The control calculating section 110, the memory 112, the deflection control circuits 130 and 132, the stage position detector 139, and the memory device 140 are connected to each other with paths. The memory device 140 stores writing data.

The control calculating section 110 includes a data generating section 50 and a writing control section 60. The data generating section 50 includes a target irradiation amount calculating section 51, an irradiation amount rounding section 52, a difference calculating section 53, a difference sum calculating section 54, and an allocating section 55. Information input to, and output from, the data generating section 50 and the writing control section 60 and information being computed are stored in the memory 112 every time when the information is input, output, or computed.

Figure 2:
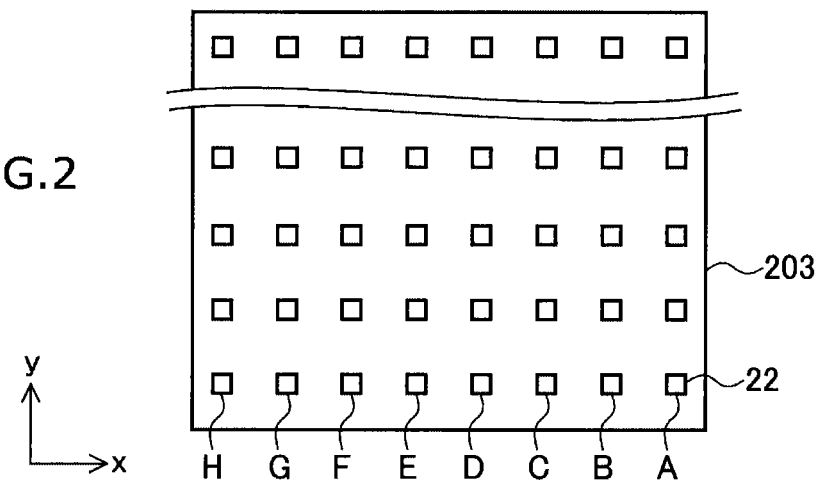
FIG. 2 schematically illustrates a configuration of an aperture member.

FIG. 2 is a conceptual illustration of a configuration of the aperture member 203. The aperture member 203 has apertures (openings) 22 that are arranged in matrix of m columns (in a y-direction) and n rows (in an x-direction) (where m, n≥2) at a predetermined arrangement pitch. For example, apertures 22 in 512×8 columns are formed. The apertures 22 are of the same rectangular shape with the same dimensions. The apertures 22 may be of the same circular shape with the same outer diameter. FIG. 2 shows an example in which eight (A to H) rectangular apertures 22, corresponding to respective eight y-direction columns, are arranged in the x-direction. Part of the electron beams 200 passes the apertures 22 and, thereby, forms multi-beams. In this example, the apertures 22 are arranged in two or more rows and two or more columns (in x- and y-directions). However, the present invention is not limited to this example. For example, a configuration in which either rows or columns (in x- or y-direction) are plural and the other is singular may be employed. As illustrated in FIG. 2, the arrangement of the apertures 22 is not limited to a lattice pattern with rows and columns. For example, vertically adjacent apertures may be alternately arranged in a staggered pattern.

Figure 3:
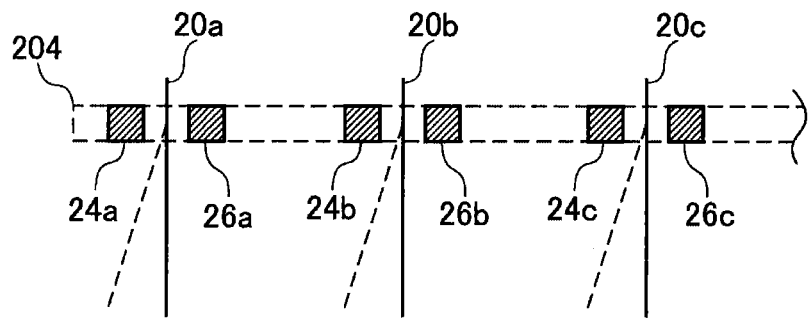
FIG. 3 schematically illustrates a configuration of a blanking plate.

FIG. 3 is a conceptual illustration of a configuration of the blanking plate 204. The blanking plate 204 has penetration holes whose locations coincide with the locations of the apertures 22 in the aperture member 203. A pair of two electrodes 24a to 24c and 26a to 26c (blankers) are disposed at each of the penetration hole. Electron beams 20a to 20c passing through the penetration holes are deflected independently of each other by voltages applied to the electrodes 24a to 24c and 26a to 26c. The blanking control is performed with this deflection. In this manner, the blankers perform blanking deflection on corresponding beams of the multi-beams that have passed through the apertures 22 (openings) in the aperture member 203.

The electron beam 200 emitted from the electron gun 201 (emission section) substantially perpendicularly illuminates the entire aperture member 203 with the illuminating lens 202. The aperture member 203 has the apertures (openings) 22, and the electron beam 200 illuminates a region including all the apertures 22. Electron beams 200 applied to the locations of the apertures 22 pass through the apertures 22 in the aperture member 203, and thereby, form a plurality of electron beams (multi-beams) 20a to 20e of, for example, rectangular shapes.

The multi-beams 20a to 20e pass through the corresponding blankers of the blanking plate 204. Each of the blankers deflects an electron beam passing through the corresponding blanker (performs blanking deflection). The multi-beams 20a to 20e that have passed through the blanking plate 204 are reduced by the reducing lens 205 and go toward a center hole in the restricting aperture member 206. Here, electron beams deflected by the blankers of the blanking plate 204 deviate from the center hole in the restricting aperture member 206 (blanking aperture member) and are blocked by the restricting aperture member 206. On the other hand, electron beams not deflected by the blankers of the blanking plate 204 pass through the center hole in the restricting aperture member 206.

Blanking control is performed by turning the blankers on or off, thereby controlling on/off states of the beams. In this manner, the restricting aperture member 206 blocks deflected beams with the blankers such that the beams are off. Beams that have passed through the restricting aperture member 206 in a period from when the beams are turned on to when the beams are turned off serve as beams corresponding to one shot. The multi-beams 20a to 20e that have passed through the restricting aperture member 206 are focused by the objective lens 207 and form a pattern image with a desired reduction ratio. The beams (the entire multi-beams) that have passed through the restricting aperture member 206 are deflected in the same direction by the deflector 208 and applied to the corresponding locations on the mask 101.

While the XY stage 105 continuously moves, the locations onto which the beams are applied are controlled by the deflector 208 such that the locations follow the movement of the XY stage 105. The XY stage 105 is caused to move by a stage control section (not shown), and the position of the XY stage 105 is detected by the stage position detector 139.

Multi-beams applied at a time are ideally arranged at a pitch obtained by multiplying the arrangement pitch of apertures in the aperture member 203 by the desired reduction ratio described above. The writing apparatus 100 performs writing operation with a raster scan technique in which shot beams are consecutively applied, and in writing a desired pattern, necessary beams are controlled to be on by blanking control in accordance with the pattern.

Figure 4A:
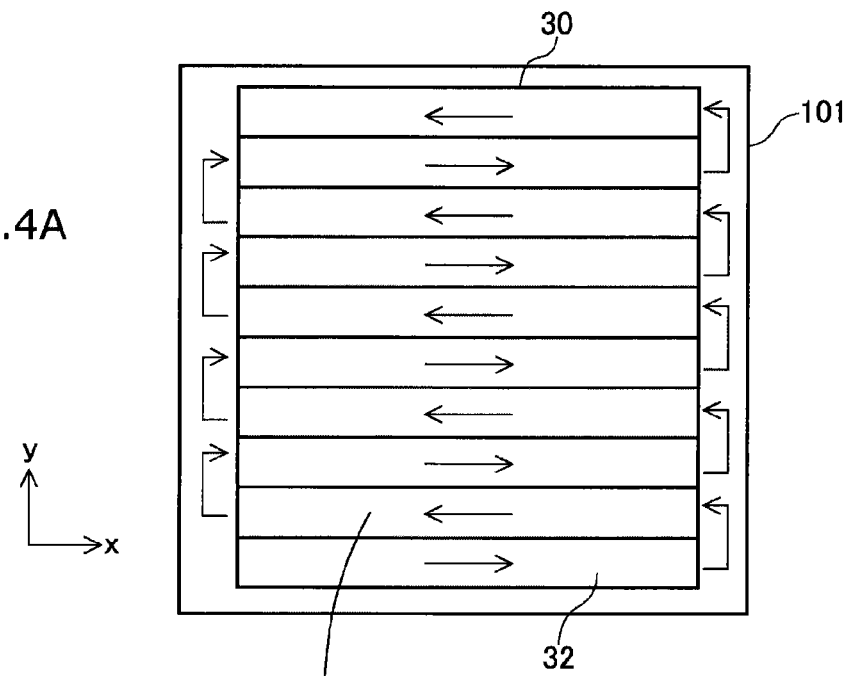
FIGS. 4A, 4B, and 4C illustrate writing operation.
Figure 4B:
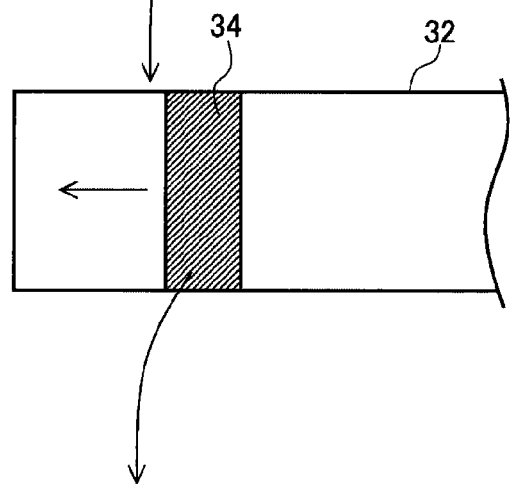
Figure 4C:
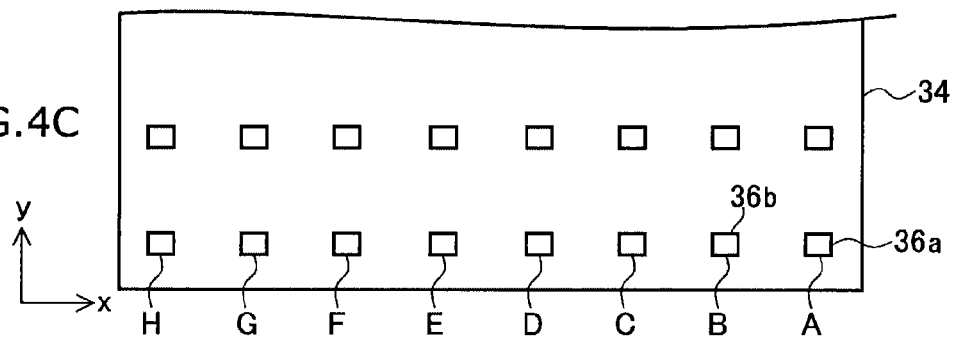

FIGS. 4A, 4B, and 4C are conceptual illustrations for describing writing operation of this embodiment. As illustrated in FIG. 4A, a writing region 30 of the mask 101 is virtually divided into a plurality of stripe regions 32 each of which has a predetermined width and which are arranged in a y-direction. Each of the stripe regions 32 serves as a writing unit region.

First, the XY stage 105 is caused to move such that a irradiation region 34 that can be irradiated with one application of multi-beams 20 is adjusted so as to be located at the left end of the first stripe region 32 or a location to the left of the left end, and writing is started. In writing the first stripe region 32, the XY stage 105 is caused to move in, for example, the -x-direction so that writing is progressed relatively in the x-direction. The XY stage 105 is, for example, continuously moved at a predetermined speed.

After the first stripe region 32 has been written, the stage position is moved in the -y-direction such that the irradiation region 34 is relatively adjusted to the y-direction so as to be located at the right end of the second stripe region 32 or a location to the right of the right end, and writing is started. As illustrated in FIG. 4B, the XY stage 105 is caused to move in, for example, the x-direction, thereby performing writing operation in the -x-direction.

Writing operations in opposite directions are alternately performed such that writing is performed in the x-direction in the third stripe region 32 and then in the -x-direction in the fourth stripe regions 32. Thus, the writing time can be reduced. The writing is not limited to the alternate writing operations in the opposite directions, and each of the stripe regions 32 may be written in the same direction.

As illustrated in FIG. 4C, multi-beams formed by beams passing through the apertures 22 in the aperture member 203 form a plurality of shot patterns 36 in the same number as the apertures 22 at a time in one shot. For example, a beam that has passed through an aperture A in the aperture member 203 is applied to the location "A" in FIG. 4C, and a shot pattern 36a is formed at this location. Similarly, for example, a beam that has passed through an aperture B in the aperture member 203 is applied to the location "B" in FIG. 4C, and a shot pattern 36b is formed at this location. The same holds for the locations C to H.

In writing the stripe regions 32, while the XY stage 105 is moving in the x-direction, writing is performed with a raster scan technique in which shot beams are consecutively applied while being deflected by the deflector 208 such that each shot sequentially moves (scans) in the y-direction or the x- and y-directions.

In the writing apparatus 100 of this embodiment, the data generating section 50 reads writing data from the memory device 140 and performs data conversion processing in multiple stages, thereby generating shot data unique to the writing apparatus. In the shot data, the irradiation amount and irradiation position coordinates of each shot are defined.

The writing control section 60 outputs the irradiation amount of each shot to the deflection control circuit 130 based on the shot data. The deflection control circuit 130 obtains an irradiation time t by dividing the input irradiation amount by a current density. Then, in performing a corresponding shot, the deflection control circuit 130 applies a deflection voltage to a corresponding blanker of the blanking plate 204 such that the blanker causes the beam to be on in the irradiation time t.

The writing control section 60 outputs deflection position data to the deflection control circuit 132 such that each beam is deflected to a location (coordinates) indicated by shot data. The deflection control circuit 132 computes a deflection amount, and applies a deflection voltage to the deflector 208. In this manner, multi-beams shot at this time are deflected at a time.

Figure 5:
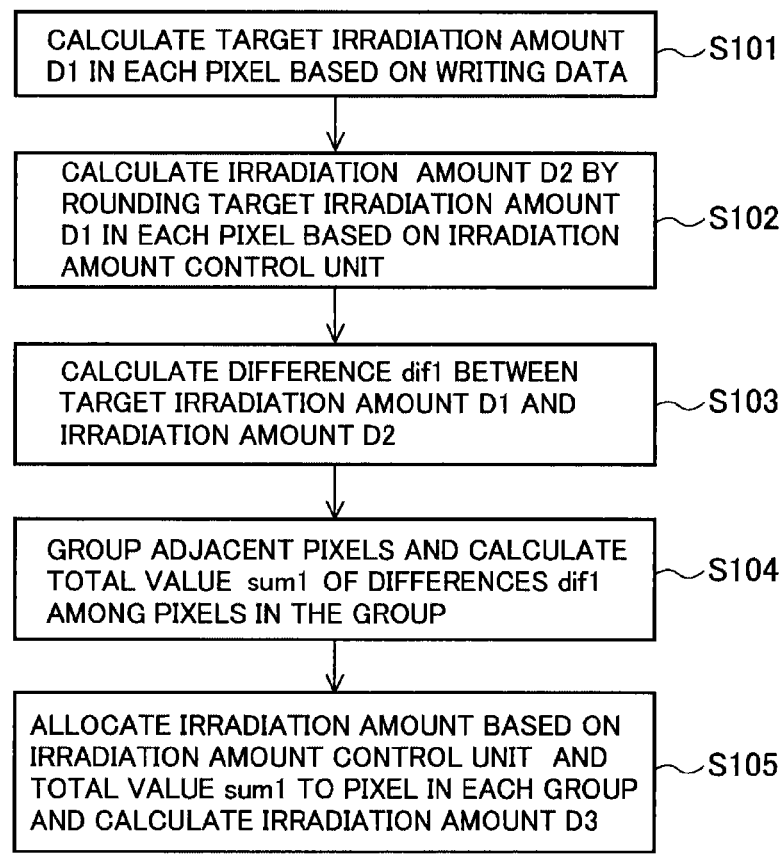
FIG. 5 is a flowchart showing a method for calculating the irradiation amount of each shot beam.

A method for calculating the irradiation amount of each shot beam by the data generating section 50 will be described with reference to the flowchart of FIG. 5. In the following description, a region on the mask 101 on which a beam that has passed through one aperture 22 in the aperture member 203 will be referred to as a pixel.

[Step S101] Based on writing data stored in the memory device 140, the target irradiation amount calculating section 51 (first calculating section) obtains an irradiation amount distribution necessary for forming a pattern. The target irradiation amount calculating section 51 calculates a target irradiation amount Di in each pixel based on the irradiation amount distribution necessary for forming a pattern and an irradiation amount distribution for correcting line width variations due to, for example, a proximity effect or a fogging effect.

[Step S102] The target irradiation amount D1 calculated at step S101 is a detailed value having a fractional portion smaller than the minimum control unit of the irradiation amount in the writing apparatus 100. Thus, the irradiation amount rounding section 52 (second calculating section) rounds the target irradiation amount D1 in each pixel based on the irradiation amount control unit (the unit of controlling the irradiation amount), and calculates an irradiation amount D2 (second irradiation amount). For example, the irradiation amount rounding section 52 drops a fractional portion less than the irradiation amount control unit.

[Step S103] The difference calculating section 53 (third calculating section) calculates a difference dif1 (first difference) between the target irradiation amount D1 and the irradiation amount D2 with respect to each pixel.

[Step S104] The difference sum calculating section 54 (fourth calculating section) groups a plurality of adjacent pixels. For example, a plurality of pixels included in a circle with a size based on beam blur (a beam resolution) are grouped. The difference sum calculating section 54 calculates a total value sum1 of the differences dif1 of the pixels in the group.

[Step S105] The allocating section 55 (fifth calculating section) additionally allocates the irradiation amount based on the irradiation amount control unit and the total value sum1 to one or more pixels in each group and calculates an irradiation amount D3 (third irradiation amount) of the pixel. In the group, the sum of the irradiation amounts D3 is closer to the sum of the target irradiation amounts D1 than the sum of the irradiation amounts D2.

For example, if the total value sum1 is less than 0.5 U where U is the irradiation amount control unit, the irradiation amount is not allocated (added) to any of the pixels. Thus, in this case, the irradiation amount D3 of each pixel in the group is equal to the irradiation amount D2.

If the total value sum1 is greater than or equal to 0.5 U and less than 1.5 U, the irradiation amount U is allocated (added) to one of the pixels in a group. Accordingly, the pixel to which the irradiation amount U is allocated has an irradiation amount D3=D2+U, and each of the other pixels has an irradiation amount D3 =D2.

If the total value sum1 is greater than or equal to 1.5 U and less than 2.5 U, the additional allocated amount of the irradiation amount is 2 U. The irradiation amount 2U may be added to one pixel in the same group, or the irradiation amount U may be added to each of two pixels. Similarly, if the total value sum1 is greater than or equal to 2.5 U, the irradiation amount is additionally allocated to one or more pixels in the same group. In this manner, the sum of fractional portions of the target irradiation amounts D1 is obtained and allocated to one or more pixels for each group.

Figure 6:
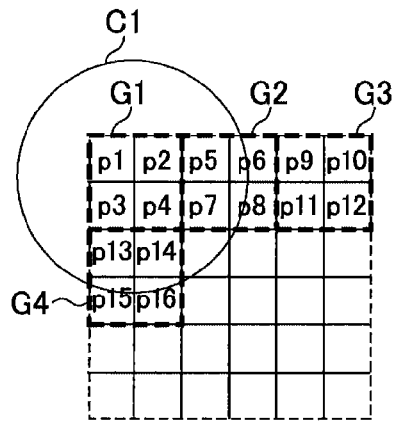
FIG. 6 shows an example of grouping of pixels.

FIG. 6 illustrates an example of grouping of pixels. As illustrated in FIG. 6, pixels p1 to p4 included in a circle C1 corresponding to the size of beam blur is grouped in a group G1. Similarly, pixels p5 to p8, p9 to p12, and p13 to p16 are grouped in groups G2, G3, and G4, respectively. The number of pixels to be grouped is not limited to the above example, and may be appropriately determined based on the size of beam blur.

Examples of the beam blur include expansion of imaging on the specimen plane determined by aberration or beam expansion due to forward scattering when a beam is applied onto a specimen coated with a resist. In lithography, it is generally practical to use the latter.

The beam blur can be approximated to a Gaussian distribution $A\exp(-(r/a)^2)$ using a distance r from a beam irradiation location on the specimen plane, a constant a, and a proportionality constant A. In this case, a can be used as a radius of the circle C1. The distance between two most distant points in the group that are furthest apart from each other, e.g., the length of the diagonal line in a case where the shape of the group is square, is preferably less than a. Here, a is about 30 nm, for example. It should be noted that a may be the same within the specimen plane, or may be distributed depending on process conditions.

An actual distribution of irradiation amount after irradiation to one pixel is obtained by convolution of a distribution diminished from an irradiation amount distribution (current distribution of a beam passing through each aperture 22 in the aperture member 203) allocated to the pixel by a reduction ratio and the beam blur described above. The obtained distribution is approximated to a Gaussian distribution. The apertures 22 are small and current distribution is supposed to be uniform. If the current distribution needs to be taken into consideration, the barycenter of the current distribution is obtained and a location of the barycenter on the specimen plane is used as a location of a corresponding pixel, for example.

FIGS. 7A to 7E illustrate examples of rounding of the target irradiation amount in each pixel and allocation of fractional portions. In the examples of FIGS. 7A to 7E, nine pixels are grouped. FIG. 7A shows the target irradiation amount D1 of each pixel. Although FIGS. 7A to 7E do not show the unit of the irradiation amount, the unit is, for example, $\mu C/cm^2$.

Suppose the irradiation amount control unit is 1, the irradiation amount D2 rounded by dropping fractional portions less than the irradiation amount control unit takes a value as shown in FIG. 7B.

In the nine pixels in this group, the difference dif1 between the target irradiation amount D1 and the irradiation amount D2 is shown in FIG. 7C, and the total value sum1 is 1.9. Since the irradiation amount control unit is 1 (one), an irradiation amount of 2 is allocated to pixels in the group. The irradiation amount of 2 may be allocated to one pixel, or an irradiation amount of 1 may be allocated to each of two pixels. For example, as shown in FIG. 7D, the irradiation amount of 2 may be allocated to the pixel at the center of the nine pixels so as to determine an irradiation amount D3.

In the examples shown in FIGS. 7A and 7B, the difference (total value sum1) between the sum of the irradiation amounts D2 and the sum of the target irradiation amounts D1 is 1.9, but the difference between the sum of the irradiation amounts D3 and the sum of the target irradiation amounts D1 is 0.1. That is, the sum of the irradiation amounts D3 is closer to the sum of the target irradiation amounts D1 than the sum of the irradiation amounts D2 is. Accordingly, the distribution of the irradiation amounts D3 is approximated to the distribution of the target irradiation amounts D1.

The data generating section 50 generates shot data including the irradiation amount D3 obtained in the foregoing manner. The writing control section 60 controls the irradiation amount of each shot based on the shot data. The pattern can be more precisely written in the case of applying beams based on the irradiation amount D3 than in the case of applying beams based on the irradiation amount D2.

In this embodiment, a plurality of pixels are grouped, a sum of fractional portions less than the minimum control unit of the target irradiation amount D1 is obtained, and the sum is allocated to a pixel in the group, thereby calculating the irradiation amount D3. The sum of the irradiation amounts D3 in the group is very close to the sum of the target irradiation amounts D1. A pattern can be precisely written by irradiation with this irradiation amount D3 of beams. The minimum control unit of irradiation time of the writing apparatus 100 does not need to be reduced. In this manner, according to this embodiment, writing precision can be increased without reduction of the minimum control unit of irradiation time.

As illustrated in FIG. 7D, in a case where the fractional irradiation amount based on the irradiation amount control unit and the total value sum1 is allocated to the pixel at the center of the group, a small amount of calculation is necessary for determining processing for determining a pixel to which the irradiation amount corresponding to fractional portions (hereinafter referred to as a "fraction allocated pixel") so that the fraction allocated pixel can be promptly determined. In a case where fraction allocated pixel is used as a center pixel, pixels of odd number x odd number are preferably grouped.

The fraction allocated pixel is not limited to the center pixel, and may be, for example, a pixel including the barycenter of distribution of the differences dif1. Suppose the pixel number in the group is i, the X-coordinate and the Y-coordinate of pixel i are respectively Xi and Yi, and a difference between the target irradiation amount D1 of pixel i and the irradiation amount D2 of pixel i is D1_i, the X-coordinate Xg and the Y-coordinate Yg of the barycenter are obtained as follows:

$Xg = \Sigma(D1\_i \times Xi)/\Sigma D1\_i$ $Yg = \Sigma(D1\_i \times Yi)/\Sigma D1\_i$ For example, as illustrated in FIG. 7E, the right pixel in the middle level includes the barycenter of distribution of the differences dif1, and the irradiation amount of 2 is additionally allocated to this pixel.

The allocation of the irradiation amount to the pixel including the barycenter makes the barycenter of distribution of the differences diff and the barycenter of distribution of the differences between the irradiation amounts D3 and the irradiation amounts D2 substantially coincide with each other. Thus, writing precision can be further increased as compared to the case of allocating the irradiation amount to the center pixel.

The allocation of the irradiation amount to the pixel including the barycenter will be further described. Suppose an infinitesimal region with a width dxi and a height dyi including a location (xi, yi) in a target group (hereinafter referred to as a region 1) is irradiated with an irradiation amount density d(xi, yi). Suppose d(xi, yi) is the difference between the target irradiation amount D1 and the irradiation amount D2. Then, if beam blur is given by a Gaussian distribution $A\exp(-(r/a)^2)$, the irradiation amount distribution of the entire region 1 at point (X, Y) is expressed by Equation 1 as follows.

$$D(X, Y) = \int\!\!\!\int_{region\,1} d(xi, yi) A\exp\left(-\frac{(X-xi)^2 + (Y-yi)^2}{a^2}\right) dxi\,dyi \quad \text{[Equation 1]}$$

In the following description, the proportionality constant A is 1. If a representative point in the region 1 is (x1, y1), the following equation is established:

$$(X-xi)^2 + (Y-yi)^2 = ((X-x1)-(xi-x1))^2 + ((Y-y1)-(yi-y1))^2 \quad \text{[Equation 2]}$$

Then, if $$\exp\left(-\frac{(X-xi)^2 + (Y-yi)^2}{a^2}\right) = \exp\left(-\frac{(X-x1)^2 + (Y-y1)^2}{a^2}\right) \quad \text{[Equation 3]}$$

$$\exp\left(\frac{2((xi-x1)(X-x1) + (yi-y1)(Y-y1)) - ((xi-x1)^2 + (yi-y1)^2)}{a^2}\right)$$

Equation 1 is changed to Equation 4 as follows:

$$D(X, Y) = \exp\left(-\frac{(X-x1)^2 + (Y-y1)^2}{a^2}\right) \times \int\!\!\!\int_{region\,1} d(xi, yi) \quad \text{[Equation 4]}$$

-continued $$\exp\left(\frac{2((xi-x1)(X-x1)+(yi-y1)(Y-y1))-}{a^2}\frac{((xi-x1)^2+(yi-y1)^2)}{}\right)dxidyi$$

Here, if approximation is performed as:

$$xi \approx x1, yi \approx y1 \quad \text{[Equation 5]}$$

$$\exp\left(-\frac{(X-xi)^2+(Y-yi)^2}{a^2}\right) \approx$$

$$\exp\left(-\frac{(X-x1)^2+(Y-y1)^2}{a^2}\right)$$

then, Equation 4 is expressed as:

$$D(X,Y) \approx \quad \text{[Equation 6]}$$

$$\exp\left(-\frac{(X-x1)^2+(Y-y1)^2}{a^2}\right)\iint_{region\,1}d(xi,yi)dxidyi$$

In Equation 6, since the integral on the right side indicates the total irradiation amount in the region 1, this equation means that the total irradiation amount from the region 1 to the point (X, Y) can be approximated as an irradiation amount obtained on the assumption that the total irradiation amount of the region 1 is applied to the point (x1, y1) in the region 1.

Next, if first-order terms of (xi−x1) and (yi−y1) are included as:

$$\exp\left(\frac{2((xi-x1)(X-x1)+(yi-y1)(Y-y1))-}{a^2}\frac{((xi-x1)^2+(yi-y1)^2)}{}\right) \approx \quad \text{[Equation 7]}$$

$$1+\frac{2((xi-x1)(X-x1)+(yi-y1)(Y-y1))}{a^2}$$

then, the result is approximated as:

$$D(X,Y) \approx \exp\left(-\frac{(X-x1)^2+(Y-y1)^2}{a^2}\right) \times \quad \text{[Equation 8]}$$

$$\left(\iint_{region\,1}d(xi,yi)dxidyi+2\iint_{region\,1}d(xi,yi)\right.$$

$$\left.\left(\frac{((xi-x1)(X-x1)+(yi-y1)(Y-y1))}{a^2}\right)dxidyi\right)$$

If (x1, y1) are:

$$x1 = xg = \iint_{region\,1}xid(xi,yi)dxidyi \bigg/ \iint_{region\,1}d(xi,yi)dxidyi \quad \text{[Equation 9]}$$

$$y1 = yg = \iint_{region\,1}yid(xi,yi)dxidyi \bigg/ \iint_{region\,1}d(xi,yi)dxidyi$$

the following equation is established:

$$\iint_{region\,1}d(xi,yi) \quad \text{[Equation 10]}$$

$$\left(\frac{((xi-xg)(X-xg)+(yi-yg)(Y-yg))}{a^2}\right)dxidyi = 0$$

Thus, a close approximation can be obtained as:

$$D(X,Y) \approx \quad \text{[Equation 11]}$$

$$\exp\left(-\frac{(X-xg)^2+(Y-yg)^2}{a^2}\right)\iint_{region\,1}d(xi,yi)dxidyi$$

The equation is further developed to the second-order terms of (xi−x1) and (yi−y1), terms proportional to the following expression appears:

$$\iint_{region\,1}(xi-x1)^2 d(xi,yi)dxidyi \quad \text{[Expression 12]}$$

$$\iint_{region\,1}(yi-y1)^2 d(xi,yi)dxidyi$$

$$\iint_{region\,1}(xi-x1)(yi-y1)d(xi,yi)dxidyi$$

Here, a is preferably larger than the diameter of a circle that can include the entire region 1. If (X, Y) is a point in the region 1, since a is larger than the distance between arbitrary two points in the region 1, the development precision of the above exponential functions can be increased.

In the writing section 150, the beam irradiation locations might have errors because of distortion of an optical system or other reasons. For example, as illustrated in FIG. 8A, pixels (radiation regions) seem to be adjacent to each other on data. Actually, in the writing section 150, however, upon irradiation with beams, an error occurs in irradiation locations on some of the pixels in a group as illustrated in FIG. 8B. If the target irradiation amount D1 shows a distribution as shown in FIG. 8C, no pixel is present at the barycenter of distribution of the differences dif1 (indicated as X in the drawing) in some cases. In this manner, if no pixel is present at the barycenter, the fractional irradiation amount may be allocated to a pixel closest to the barycenter or may be dispersed to a plurality of pixels near the barycenter.

FIG. 8D shows a distribution of the irradiation amounts D3 on data in a case where the fractional irradiation amount is allocated to the pixel closest to the barycenter. FIG. 8E shows a distribution of the irradiation amounts D3 on data in a case where the fractional irradiation amount is allocated to two pixels near the barycenter.

In this manner, the barycenter of distribution of the differences dif1 is calculated in consideration of, for example, the effect of distortion of the optical system of the writing section 150, and the fractional irradiation amount is allocated to one or more pixels, thereby further increasing writing precision.

Fraction allocated pixels may be determined in consideration of moments. For example, the fractional irradiation amount is allocated such that the moment of distribution of the differences dif1 and the moment of distribution of the differences between the irradiation amounts D3 and the irradiation amounts D2 are approximately the same.

Specifically, suppose the difference between the irradiation amount D3 and the irradiation amount D2 of a pixel i after allocation of the fractional irradiation amount is D3_i, for example, the fractional irradiation amount is allocated such that the difference between $\Sigma(D1_{-i \times (Xi-Xg)}{}^2)/\Sigma D1\_i$ and $\Sigma(D3\_i \times (Xi-Xg)^2)/\Sigma D3\_i$, the difference between $\Sigma(D1\_i \times (Yi-Yg)^2)/\Sigma D1\_i$ and $\Sigma(D3\_i \times (Yi-Yg)^2)/\Sigma D3\_i$, and the difference between $\Sigma(D1\_i \times (Xi-Xg) \times (Yi-Yg))/\Sigma D1\_i$ and $\Sigma(D3\_i \times (Xi-Xg) \times (Yi-Yg))/\Sigma D3\_i$ are small. This allocation of the fractional irradiation amount in consideration of moments is preferably performed in a case where the allocated amount of the irradiation amount is greater than or equal to twice as large as the irradiation amount control unit and the fractional irradiation amount can be allocated to a plurality of pixels.

Higher moments may be taken into consideration. If the irradiation amount and the number of pixels for allocation are large, higher moments may be taken into consideration. Then, writing precision can be further increased.

FIGS. 9A, 9B, and 9C show examples of allocation of the fractional irradiation amount in consideration of moments. FIG. 9A shows a distribution of the target irradiation amounts D1. FIG. 9B shows a distribution of the irradiation amounts D2 obtained by dropping and rounding fractional portions less than the irradiation amount control unit. FIG. 9C shows a distribution of the irradiation amounts D3 in a case where the fractional irradiation amount is allocated in consideration of moments in addition to the barycenter. In this example, an irradiation amount of 1 is allocated to a right pixel and a left pixel on the middle level.

In this manner, the fraction allocated pixels are determined in consideration of moments. Thus, the distribution of the irradiation amounts D3 is approximated to the distribution of the target irradiation amount D1, thereby further increasing writing precision.

The grouping of pixels and allocation of the fractional irradiation amount described above may also be applied to a writing technique in which multi-writing is performed while the irradiation location is being shifted. For example, as illustrated in FIG. 10A, the multiplicity is 2, and four pixels p1 to p4 in the first layer and four pixels p1' to p4' in the second layer shifted in the x- and y-directions are grouped. FIG. 10B shows a distribution of the target irradiation amounts D1. FIG. 10C shows a distribution of the irradiation amounts D2 obtained by dropping and rounding fractional portions less than the irradiation amount control unit. FIG. 10D shows a distribution of the irradiation amounts D3 in which the fractional irradiation amount is allocated.

As described above, in the case of performing multi-writing, pixels in a plurality of layers may be grouped so that the fractional irradiation amount is allocated to these pixels.

This embodiment may be performed such that a plurality of pixels included in a circle of a size based on a beam resolution are grouped in a first group, a plurality of such first groups are grouped in a second group, the sum of differences between the target irradiation amounts D1 and the irradiation amounts D3 in the pixels in the second group is additionally allocated to one or more pixels, and an irradiation amount D4 (fourth irradiation amount) in each pixel is calculated. The data generating section 50 generates shot data including the irradiation amount D4.

For example, the difference calculating section 53 calculates the difference dif2 (second difference) between the target irradiation amount D1 and the irradiation amount D3 with respect to each pixel.

Figure 11:
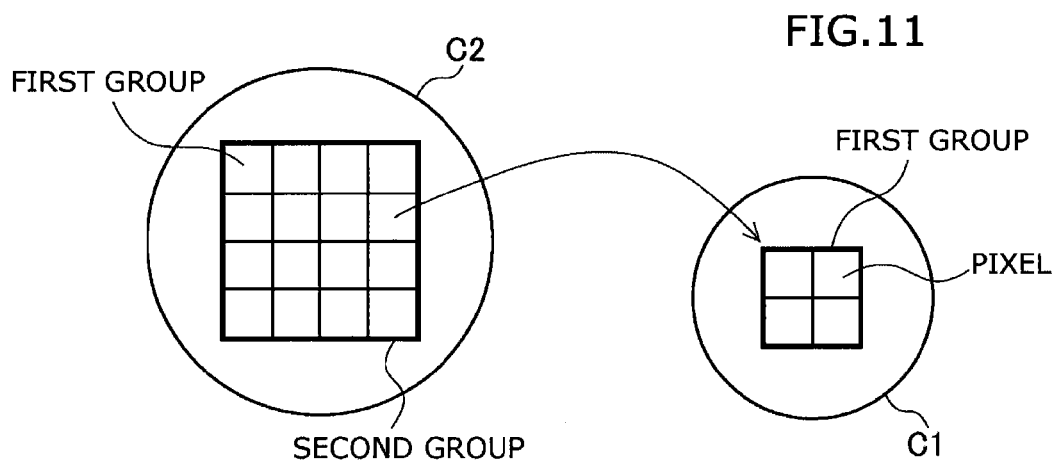
FIG. 11 is an example showing an example of grouping of pixels.

Next, the difference sum calculating section 54 groups a plurality of first groups in a second group. The second group includes a large number of pixels than each of the first groups. For example, as illustrated in FIG. 11, a plurality of first groups included in a circle C2 defined depending on the degree of backward scattering are grouped in a second group. The difference sum calculating section 54 calculates a total value sum2 of the difference dif2 for pixels in the second group.

The distribution of the backward scattering can be approximated to a Gaussian distribution $B\exp(-(r/b)^2)$ using a distance r from a beam irradiation location on the specimen plane, a constant b, and a proportionality constant B. In this case, the radius of the circle C2 is approximately equal to b. Since b is, for example, about 10 μm, the radius of the circle C2 is much larger than the radius of the circle C1. It should be noted that b may be the same within the specimen plane, or may be distributed depending on process conditions.

Subsequently, the allocating section 55 (additionally) allocates an irradiation amount based on the irradiation amount control unit and the total value sum2 to one or more pixels in the second group, and calculates the irradiation amount D4 in each pixel. In the second group, the sum of the irradiation amounts D4 is closer to the sum of the target irradiation amounts D1 than the sum of the irradiation amounts D3 is. The pixel to which the irradiation amount is allocated may be a pixel at the center of the second group or a pixel including the barycenter of distribution of the differences dif2. The pixel to which the irradiation amount is allocated may be determined in consideration of moments of distribution of the differences dif2.

In this manner, a plurality of first groups included in a circle of a size based on backward scattering are grouped in a second group, and the irradiation amount based on the irradiation amount control unit and the total value sum2 is allocated to a pixel in the second group. Thus, the sum of the irradiation amounts D4 in the second group is very close to the sum of the target irradiation amounts D1. Irradiation with beams based on shot data including the irradiation amount D4 effectively reduces a line width variation due to a proximity effect, and enables precise writing of a pattern.

The number of levels of groups are not limited to two, i.e., the layer of the first groups and the layer of the second group, and may be three or more. For example, the difference calculating section 53 calculates a difference dif3 (third difference) between the target irradiation amount D1 and the irradiation amount D4 with respect to each pixel.

Then, the difference sum calculating section 54 groups a plurality of second groups in a third group. For example, a plurality of second groups included in a region determined depending on the range of a fogging effect and a loading effect are grouped in a third group. The difference sum calculating section 54 calculates a total value sum3 of the difference dif3 among pixels in the third group.

The size of the third group may be the same within the specimen plane, or may be distributed. If the third group is enlarged within the range in which a necessary precision is obtained, the number of calculations for correction can be reduced.

Subsequently, the allocating section 55 (additionally) allocates the irradiation amount based on the irradiation amount control unit and the total value sum3 to one or more pixels in the third group, and calculates an irradiation amount D5 (fifth irradiation amount) in each pixel. The data generating section 50 generates shot data including the irradiation amount D5. Irradiation of beams based on the shot data including the irradiation amount D5 can effectively reduce line width variations caused by, for example, a proximity effect, a fogging effect, and a loading effect, thereby precisely writing a pattern.

The raster scan operation described in the foregoing embodiment is an example, and the raster scan operation using multi-beams may be other types of operations.

To produce multi-beams, the blanking aperture array is employed in the above embodiment. Alternatively, multi-beams may be produced by an electron source itself.

In the case of using laser beams as energy beams, a technique in which an optical image patterned by a reflecting optical system using a reflecting mirror array for controlling reflection angles of a plurality of reflecting mirrors that are disposed one or two dimensionally or a technique of scanning with laser beams that can be controlled on or off independently of each other may be employed.

The writing apparatus does not necessarily use multi-beams and may use a single beam.

In the examples of the embodiment described above, the irradiation amount rounding section 52 drops fractional portions less than the irradiation amount control unit. Alternatively, other processes such as rounding may be performed on fractional portions.

At least part of the control calculating section 110 described in the above embodiments may be implemented in either hardware or software. When implemented in software, a program that realizes at least part of functions of the control calculating section 110 may be stored on a recording medium such as a flexible disk or CD-ROM and read and executed by a computer. The recording medium is not limited to a removable recording medium such as a magnetic disk or optical disk, but may be a non-removable recording medium such as a hard disk device or memory.

The writing operation by the writing section 150 may be controlled such that shot data generated by the data generating apparatus including the data generating section 50 beforehand is stored in the memory section and read out from the memory section by the writing control section 60.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An energy beam writing apparatus comprising: a writing section configured to write a pattern by irradiating an object with an energy beam; and a control calculating section configured to control the writing section, wherein the control calculating section includes a data generating section that generates shot data including a third irradiation amount and includes a target irradiation amount calculating section configured to calculate a first irradiation amount of a beam in each pixel of a plurality of pixels on the object, each pixel being an area onto which one beam is applied, based on writing data, an irradiation amount rounding section configured to round the first irradiation amount based on a predetermined irradiation amount control unit and calculate a second irradiation amount with respect to each pixel, a difference calculating section configured to calculate a first difference that is a difference between the first irradiation amount and the second irradiation amount with respect to each pixel, a difference sum calculating section configured to calculate a sum of the first differences in a first group of a plurality of adjacent pixels, and an allocating section configured to allocate an irradiation amount based on the irradiation amount control unit and the sum of the first differences to a pixel in the first group and calculate the third irradiation amount in each pixel, and a writing control section that controls the writing section based on the shot data.

2. The energy beam writing apparatus according to claim 1, wherein
the writing section includes
an emission section configured to emit an energy beam,
an aperture member in which a plurality of openings are formed and which is configured to form multi-beams by letting a region including a whole of the plurality of openings be irradiated by the energy beam and letting parts of the energy beam pass through a corresponding opening of the plurality of openings respectively, and
a blanking plate configured to be provided with a plurality of blankers which perform blanking deflection of a corresponding beam respectively in multi-beams having passed through the plurality of openings of the aperture member, wherein
the writing control section controls the multi-beams based on an irradiation amount of a beam in each pixel.

3. The energy beam writing apparatus according to claim 1, wherein
the difference calculating section calculates a second difference that is a difference between the first irradiation amount and the third irradiation amount,
the difference sum calculating section calculates a sum of the second differences in a second group including a larger number of pixels than the first group,
the allocating section allocates an irradiation amount based on the irradiation amount control unit and the sum of the second differences to a pixel in the second group and calculates a fourth irradiation amount in each pixel, and
the data generating section generates shot data including the fourth irradiation amount.

4. The energy beam writing apparatus according to claim 3, wherein
the difference calculating section calculates a third difference that is a difference between the first irradiation amount and the fourth irradiation amount with respect to each pixel,
the difference sum calculating section calculates a sum of the third differences in a third group including a larger number of pixels than the second group,
the allocating section allocates an irradiation amount based on the irradiation amount control unit and the sum of the third differences to a pixel in the third group and calculates a fifth irradiation amount in each pixel, and
the data generating section generates shot data including the fifth irradiation amount.

5. The energy beam writing apparatus according to claim 4, wherein
the first group is a group of pixels in a number based on a beam resolution of the writing section, the second group is a group of pixels in a number based on backward scattering in the writing section, and the third group is a group of pixels in a number based on a fogging effect or a loading effect in the writing section.

6. An energy beam writing method for writing a pattern by irradiating an object with an energy beam, the method comprising: calculating a first irradiation amount in each pixel of a plurality of pixels on the object, each pixel being an area onto which one beam is applied, based on writing data; calculating a second irradiation amount by rounding the first irradiation amount based on a predetermined irradiation amount control unit with respect to each pixel; calculating a first difference that is a difference between the first irradiation amount and the second irradiation amount with respect to each pixel; calculating a sum of the first differences in a first group that is a group of a plurality of adjacent pixels; allocating an irradiation amount based on the irradiation amount control unit and the sum of the first differences to a pixel in the first group and calculating a third irradiation amount in each pixel; and irradiating an object with an energy beam while controlling an irradiation amount in each pixel such that the irradiation amount coincides with the third irradiation amount.

7. The energy beam writing method according to claim 6, wherein
the object is irradiated with a plurality of energy beams.

8. The energy beam writing method according to claim 6, further comprising:
calculating a second difference that is a difference between the first irradiation amount and the third irradiation amount with respect to each pixel;
calculating a sum of the second differences in a second group including a larger number of pixels than the first group; and
allocating an irradiation amount based on the irradiation amount control unit and the sum of the second differences to a pixel in the second group and calculating a fourth irradiation amount in each pixel, wherein
the object is irradiated with an energy beam by controlling an irradiation amount in each pixel such that the irradiation amount coincides with the fourth irradiation amount.

9. The energy beam writing method according to claim 8, further comprising:
calculating a third difference that is a difference between the first irradiation amount and the fourth irradiation amount with respect to each pixel;
calculating a sum of the third differences in a third group including a larger number of pixels than the second group; and
allocating an irradiation amount based on the irradiation amount control unit and the sum of the third differences to a pixel in the third group and calculating a fifth irradiation amount in each pixel, wherein
the object is irradiated with an energy beam by controlling an irradiation amount in each pixel such that the irradiation amount coincides with the fifth irradiation amount.

10. The energy beam writing method according to claim 9, wherein
the first group is a group of pixels in a number based on a beam resolution of an energy beam writing apparatus,
the second group is a group of pixels in a number based on backward scattering in the energy beam writing apparatus, and
the third group is a group of pixels in a number based on a fogging effect or a loading effect in the energy beam writing apparatus.

* * * * *